United States Patent
Chen et al.

(10) Patent No.: US 7,177,221 B1
(45) Date of Patent: Feb. 13, 2007

(54) INITIALIZING MEMORY BLOCKS

(75) Inventors: Zheng Chen, Macungie, PA (US);
Nhon Nguyen, Austin, TX (US);
Hemanshu Vernenker, Austin, TX (US); Allen White, Austin, TX (US);
Christopher Hume, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 47 days.

(21) Appl. No.: 11/015,265

(22) Filed: Dec. 16, 2004

(51) Int. Cl.
*G11C 17/18* (2006.01)

(52) U.S. Cl. .............. 365/225.7; 365/230.03; 326/39; 326/41

(58) Field of Classification Search .............. 365/225.7, 365/230.03; 326/39, 41
See application file for complete search history.

(56) References Cited

U.S. PATENT DOCUMENTS 5,550,782 A * 8/1996 Cliff et al. ............. 365/230.03
5,811,987 A * 9/1998 Ashmore et al. ............. 326/39
6,157,210 A * 12/2000 Zaveri et al. .................. 326/40
6,201,404 B1 * 3/2001 Reddy et al. .................. 326/10

OTHER PUBLICATIONS

Chen et al., Programmable Broadcast Initialization of Memory Blocks, U.S. Appl. No. 10/641,260, filed Aug. 13, 2003.

* cited by examiner

*Primary Examiner*—Richard Elms
*Assistant Examiner*—Eric J. Wendler
(74) *Attorney, Agent, or Firm*—MacPherson Kwok Chen & Heid LLP; Greg J. Michelson

(57) ABSTRACT

In accordance with one embodiment of the present invention, a programmable logic device includes at least one block of memory having a plurality of memory cells and a plurality of fuses adapted to provide a first set of signals that determines a first configuration for the at least one block of memory. A plurality of multiplexers are adapted to select the first set of signals from the plurality of fuses to configure the at least one block of memory in the first configuration or a second set of signals to configure the at least one block of memory in a second configuration.

20 Claims, 4 Drawing Sheets

INITIALIZING MEMORY BLOCKS

TECHNICAL FIELD

The present invention relates generally to electrical circuits and, more particularly, to memory within an integrated circuit.

BACKGROUND

When an integrated circuit (e.g., a programmable logic device (PLD)) is powered-up and configured and depending upon the intended application, the contents of its embedded memory may be unknown (e.g., a do not care condition when used as random access memory). Alternatively, it may be desired that the contents of one or more of the blocks of memory be known or pre-defined (e.g., when used as read only memory) as the PLD begins to perform its user-defined functions (i.e., user mode or normal mode). If the contents of the memory must be known (pre-defined), the blocks of memory generally must be initialized (pre-loaded) with the desired information (e.g., configuration data via a configuration bitstream) during configuration of the PLD.

There are a number of methods for initializing embedded memory (e.g., blocks of memory) in an integrated circuit. For example for a PLD (e.g., a field programmable gate array or a complex programmable logic device), one method utilizes the data lines, address lines, and configuration logic circuitry, which are utilized to configure the fuses (e.g., static random access memory cells) of the programmable logic device, to also initialize the memory cells of the embedded memory. However, this method may slow down the configuration process of the programmable logic device and may waste bitstream storage space. As a result, there is a need for an improved method for initializing embedded memory.

SUMMARY

In accordance with one embodiment of the present invention, a programmable logic device includes at least one block of memory having a plurality of memory cells; a plurality of fuses adapted to provide a first set of signals that determines a first configuration for the at least one block of memory; and a plurality of multiplexers adapted to select the first set of signals from the plurality of fuses to configure the at least one block of memory in the first configuration or a second set of signals to configure the at least one block of memory in a second configuration.

In accordance with another embodiment of the present invention, an integrated circuit includes a plurality of configurable blocks of memory; a plurality of fuses adapted to provide a first set of signals for configuring the configurable blocks of memory; and means for selecting between the first set of signals and a second set of signals for configuring the configurable blocks of memory.

In accordance with another embodiment of the present invention, a method of configuring memory within an integrated circuit includes providing configuration data to fuses during configuration of the integrated circuit, wherein at least a first set of the fuses provides a first set of signals based on the stored configuration data for configuring at least one block of memory within the integrated circuit; and selecting between the first set of signals and a second set of signals for configuring the at least one block of memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
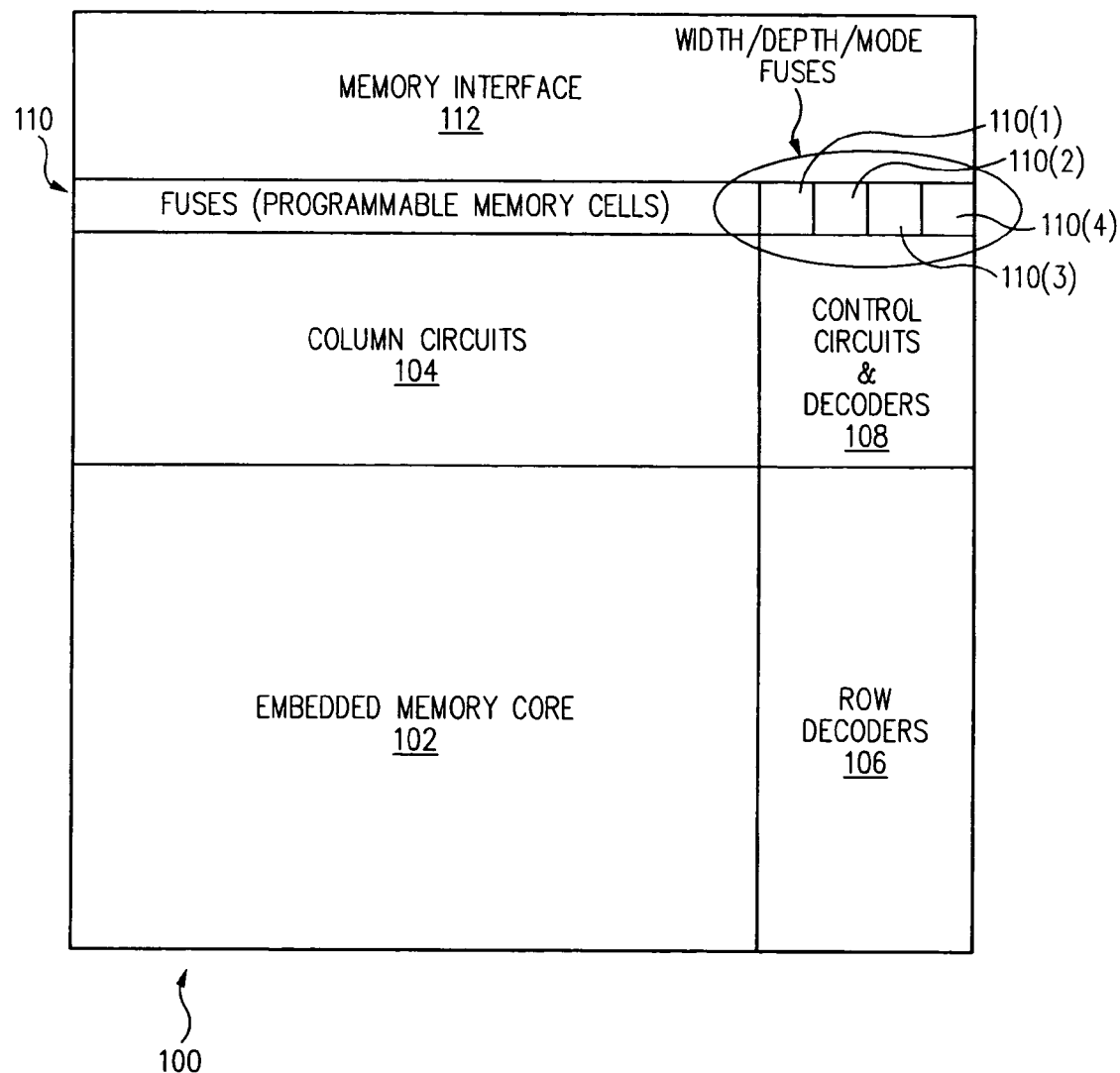
FIG. 1 shows a block diagram illustrating a block of memory within an integrated circuit in accordance with an embodiment of the present invention.

FIG. 1 shows a block diagram illustrating an embedded block of memory 100 within an integrated circuit (e.g., a programmable logic device) in accordance with an embodiment of the present invention. Memory 100 illustrates an exemplary memory within the integrated circuit, with memory 100 representing the only block of embedded memory within the integrated circuit or one of many blocks of memory 100 within the integrated circuit.

Memory 100 includes a memory core 102, column circuits 104, row decoders 106, decoders 108 (e.g., control circuits and decoders), fuses 110, and a memory interface 112. Memory core 102 represents the memory cells (e.g., static random access memory cells) of memory 100 that store the desired information. Column circuits 104, row decoders 106, and decoders 108 represent the circuitry for controlling, decoding, and addressing the memory cells within memory core 102. Memory interface 112 represents the interface between memory 100 and other portions of the integrated circuit.

Fuses 110 (e.g., programmable static random access memory cells, fuses, anti-fuses, or other types of configuration memory (volatile or nonvolatile), including one-time programmable devices) may be set to configure or determine the functions or mode of memory 100 as is known in the art. For example, memory 100 may be a configurable multi-port memory within a programmable logic device, with the values stored in fuses 110 determining the width, depth, and mode (e.g., single port, dual port, pseudo-dual port mode, and/or other read/write functionality) of memory 100.

In this exemplary implementation shown in FIG. 1, fuses 110 include four of fuses 110, which are separately referenced as fuses 110(1), 110(2), 110(3), and 110(4) and which determine the depth, width, and mode of memory 100. However, it should be understood that any number of fuses 110 (also known as configuration memory cells) may be implemented to set the depth, width, and mode of a memory for a desired application or design. The values stored in fuses 110 are provided to decoders 108 to set the depth, width, and mode of memory 100, as would be known by one skilled in the art, with the values programmed into fuses 110 via the address and data lines of the configuration circuitry of the integrated circuit (e.g., PLD).

In one memory initialization approach, more than one configuration cycle may be required for the PLD, with one configuration cycle for memory initialization (also referred to as system bus initialization) followed by another configuration cycle to set the desired memory width, depth, and/or mode for user mode operation. For example, assume memory 100 can be configured in different depth by width configurations (e.g., 512 by 36, 1,028 by 18, or 2,048 by 9 bits) as well as different write modes (e.g., traditional write, read-before-write, or write-through). If the system bus must initialize memory 100 in a particular width/depth/mode configuration (e.g., 2,048 by 9 bits in the traditional write mode), while after initialization the user expects to utilize memory 100 in a different configuration (e.g., 512 by 36 bits in the read-before-write mode), then two configuration cycles are required.

The first configuration cycle or sequence would be required after power up to program fuses 110 (e.g., fuses 110(1) through 110(4) for the exemplary implementation of FIG. 1) to configure memory 100 as 2,048 by 9 bits in the traditional write mode for memory initialization (system bus initialization). The second configuration cycle or sequence would be required after the memory initialization is completed to program fuses 110 (e.g., fuses 110(1) through 110(4) for the exemplary implementation of FIG. 1) to configure memory 100 as 512 by 36 bits in the read-before-write mode as desired by the user for user mode of operation of the PLD. Thus, two configuration cycles may be required, depending upon the user's requirements and desired application, which increases the time required to configure the PLD.

In accordance with an embodiment of the present invention, an alternative approach for memory initialization requires only one configuration cycle or sequence. Fuses 110 (e.g., fuses 110(1) through 110(4) for the exemplary implementation of FIG. 1) are programmed during configuration with the appropriate values required for the desired user mode. However, during memory initialization (e.g., via the system bus), the values provided by fuses 110 are masked by a control signal (e.g., a system bus enable control signal) allowing the substitution of alternate initialization signals.

Therefore, the circuits that are driven by fuses 110 (e.g., decoders 108) are provided with high or low signal level states, as required, so that memory 100 is forced into the appropriate configuration/mode during memory initialization. Once memory initialization is completed, the control signal (e.g., the system bus enable control signal) is deasserted and memory 100 returns to the user mode configuration as determined by the values of fuses 110. Consequently, there is no need for another configuration cycle after memory initialization, as may be required for some approaches.

Figure 2:
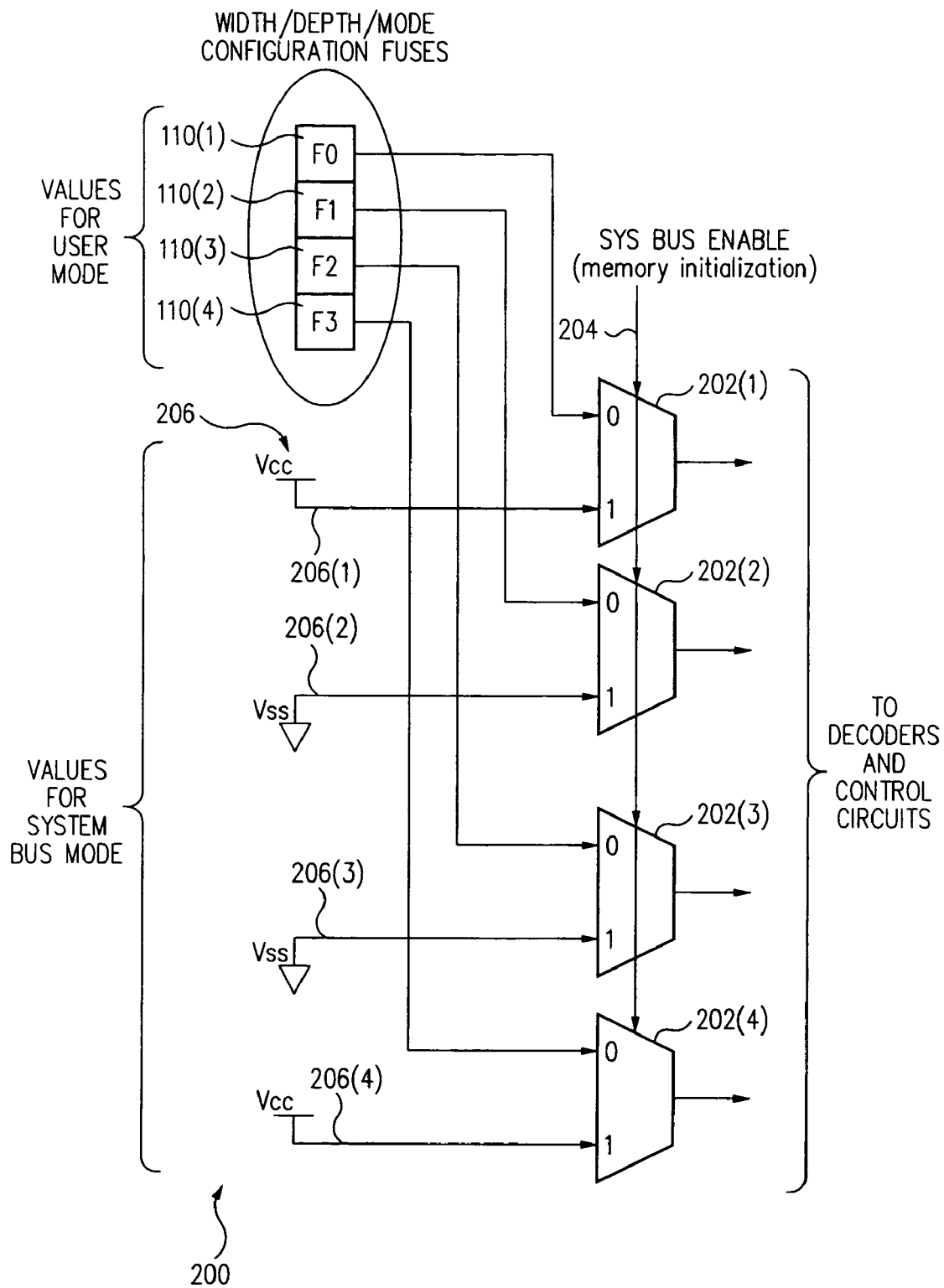
FIG. 2 shows a block diagram illustrating a technique to mask certain signals to the memory of FIG. 1 in accordance with an embodiment of the present invention.

For example, FIG. 2 shows a block diagram 200 illustrating a technique to mask certain signals from fuses 110 in accordance with an embodiment of the present invention. Diagram 200 includes fuses 110(1) through 110(4) and multiplexers 202 (which are separately referenced as multiplexers 202(1) through 202(4)).

As discussed, fuses 110(1) through 110(4) store and provide the values to decoders 108 (control circuits and decoders), which determine user mode depth, width, and mode configuration of memory 100. Multiplexers 202, controlled by a control signal 204 (e.g., labeled a system bus enable control signal or memory initialization control signal), determines whether the values from fuses 110(1) through 110(4) or a substitute set of signals 206 are provided to decoders 108.

Specifically, for example, control signal 204 is asserted or not depending upon whether memory 100 is in the system bus initialization mode (i.e., memory initialization mode) or in the user mode (normal user-defined operation). When asserted, for example for system bus initialization mode, control signal 204 controls multiplexers 202 to route the values of signals 206 to decoders 108, rather than the values stored in fuses 110(1) through 110(4). Thus, memory 100 is forced into a particular configuration that the system bus is expecting during memory initialization (regardless of the code stored in fuses 110(1) through 110(4) for depth, width, and mode memory configuration).

As shown in FIG. 2, signals 206 may be hard-coded in the integrated circuit, which in this case has values of F[0:3]= 1001 (i.e., signals 206(1) through 206(4) provide signal values 1, 0, 0, and 1, respectively, where Vcc represents a high signal level and Vss represents a low signal level). Fuses 110(1) through 110(4) are programmed with the code associated with the user-defined configuration desired for memory 100 during the normal mode of operation (user-defined operation, where the PLD performs the functions desired by the user).

Once memory 100 is initialized, control signal 204 is deasserted, for example for user mode, with multiplexers 202 then routing the values of fuses 110(1) through 110(4) (labeled F0 through F3, respectively) to decoders 108 to set the depth, width, and mode of memory 100. Thus, memory 100 becomes usable in the desired user mode without the need for another configuration cycle.

Multiplexers 202, for example, may be incorporated as part of decoders 108 or situated near decoders 108 (e.g., between fuses 110 and decoders 108). Signals 206, for example, may be hard-wired as shown in FIG. 2 to defined values or may be provided by fuses (e.g., another set of fuses 110) or from other control circuits (not shown) that determine the desired values of signals 206.

Figure 3A:
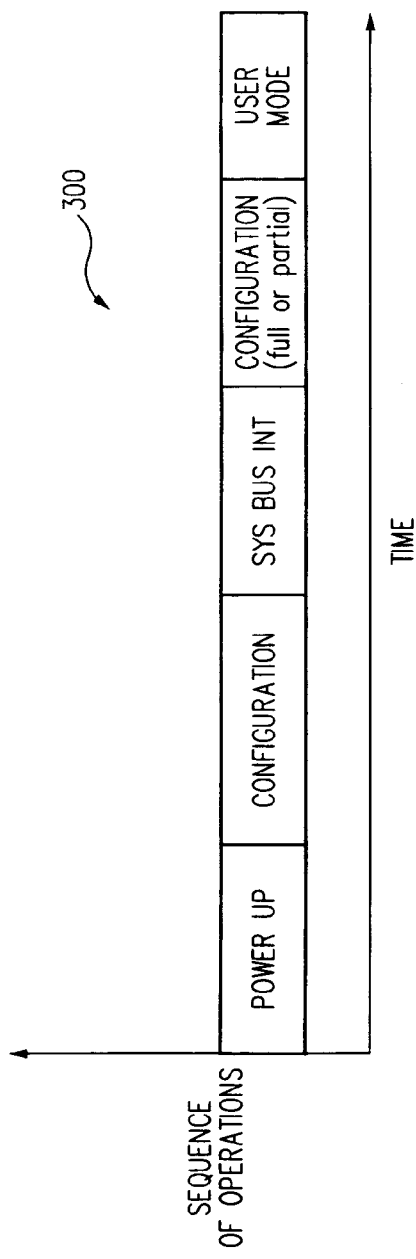
FIG. 3a shows a timing bar diagram for a configuration sequence in accordance with an embodiment of the present invention.

FIG. 3a shows a timing bar diagram 300 for a configuration sequence in accordance with an embodiment of the present invention. Diagram 300 illustrates the first approach for memory initialization, discussed above, which may require an additional configuration cycle. For example, upon power up, fuses 110(1) through 110(4) would be programmed during configuration with the code (values) associated with system bus initialization for memory initialization (labeled sys bus init). After completion of memory initialization, an additional configuration may be necessary to program fuses 110(1) through 110(4) with the proper values for memory configuration during user mode.

Figure 3B:
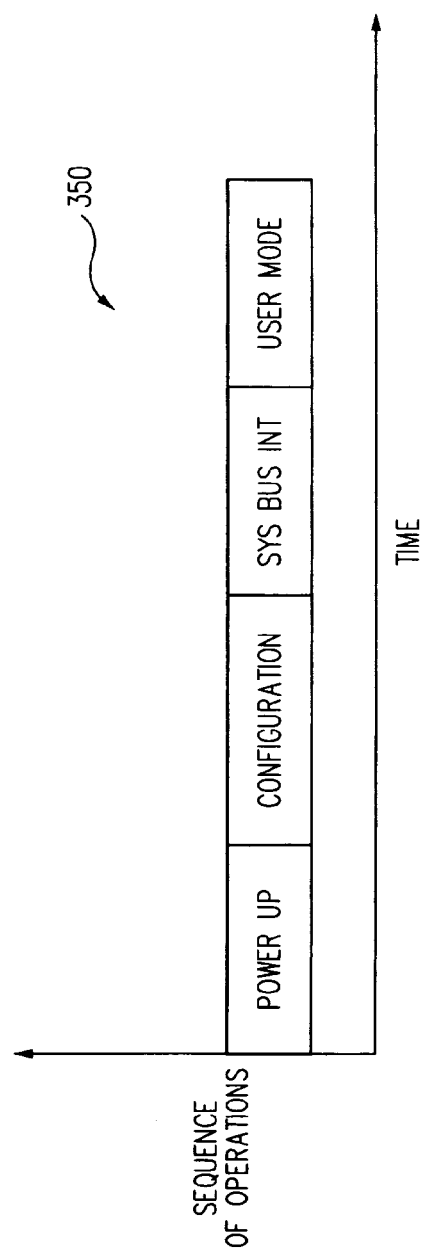
FIG. 3b shows a timing bar diagram for a configuration sequence in accordance with an embodiment of the present invention.

In contrast, FIG. 3b shows a timing bar diagram 350 for a configuration sequence in accordance with an embodiment of the present invention. Diagram 350 illustrates the second approach for memory initialization, discussed above in reference to FIG. 2, which does not require an additional configuration cycle for memory initialization. For example, upon power up, fuses 110(1) through 110(4) are programmed during configuration with the code (values) desired for the configuration of memory 100 during user mode of operation. These values are masked or substituted, however, during system bus initialization (memory initialization) with values desired to configure memory 100 during memory initialization.

After completion of memory initialization, the values stored in fuses 110(1) through 110(4) are unmasked and provided to configure memory 100 for user mode of operation. Thus, an additional configuration cycle is not required, as in the previous approach illustrated in FIG. 3a where one configuration cycle configures the fuses for memory initialization and another configuration cycle configures the fuses for user mode, which may add significantly to the time to configure and the necessary bitstream size for configuration.

In accordance with one or more embodiments of the present invention, systems and methods are disclosed for initializing memory within an integrated circuit (e.g., such as a PLD having multi-port memory blocks that can be configured in different depths, widths, and modes). For example, techniques are disclosed for masking the user mode fuse values to force the required depth, width, and mode configuration of the memory during memory initialization (i.e., system bus mode) via a control signal (e.g., a system bus enable control signal).

The control signal is then deasserted after memory initialization to allow the memory to be configured for the desired user mode. Thus, the fuses do not have to be programmed twice, once to configure the memory for memory initialization and a second time to configure the memory for user mode operation. Furthermore, the circuitry and die overhead is minimal, with for the exemplary implementation example of FIG. 2 requiring only four 2:1 multiplexers to provide the appropriate signal routing.

Figure 4:
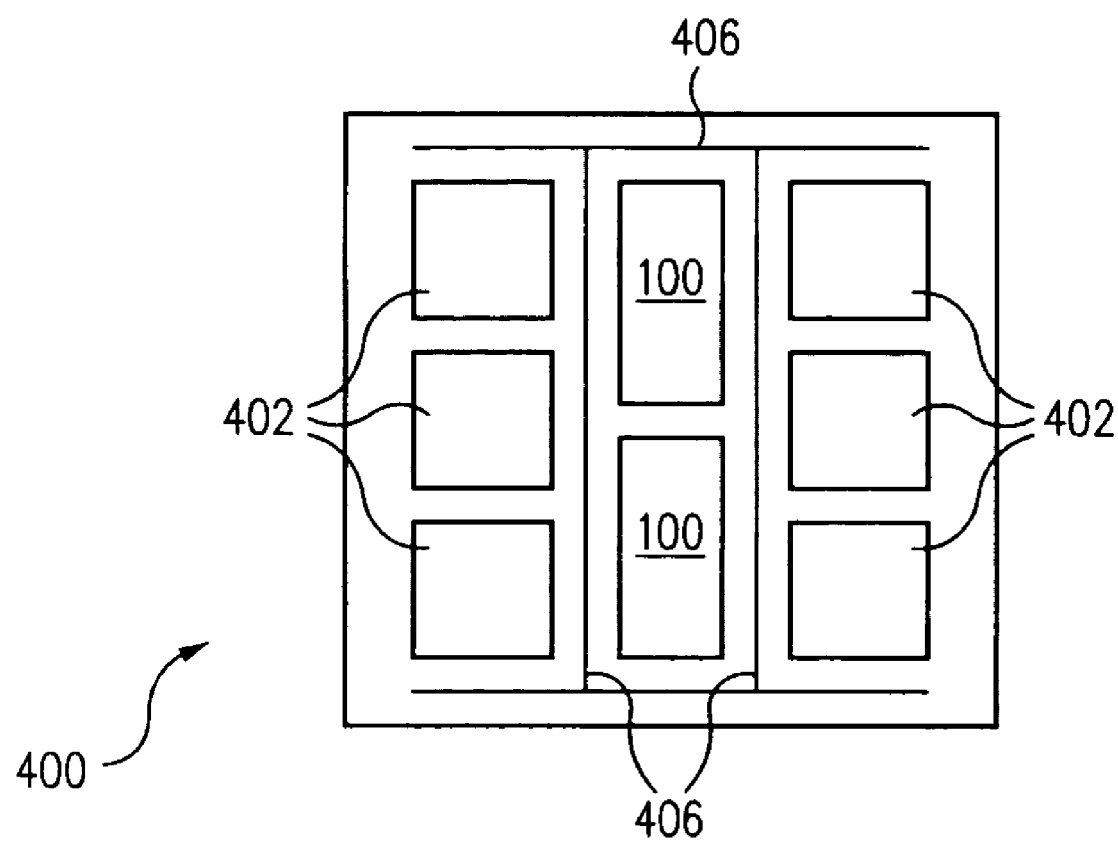
FIG. 4 shows a block diagram of a programmable logic device in accordance with an embodiment of the present invention.

The techniques disclosed herein are applicable for various types of integrated circuits having one or more blocks of memory. For example, FIG. 4 illustrates a simplified block diagram of a programmable logic device (PLD) 400 in accordance with an embodiment of the present invention. PLD 400 includes a number of blocks of memory 100 distributed among a number of logic blocks 402. Logic blocks 402 may be any type of logic or circuitry desired, such as for example lookup tables or AND/OR arrays. Configuration lines and circuitry 406 are provided, as is known in the art, to route configuration data within PLD 400.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
at least one block of memory having a plurality of memory cells;
a plurality of fuses adapted to provide a first set of signals that determines a first configuration for the at least one block of memory; and
a plurality of multiplexers adapted to select the first set of signals from the plurality of fuses to configure the at least one block of memory in the first configuration or a second set of signals to configure the at least one block of memory in a second configuration.

2. The programmable logic device of claim 1, wherein the plurality of multiplexers is controlled by a first control signal to select the first set of signals during a user mode of operation and to select the second set of signals during a memory initialization mode of operation of the at least one block of memory.

3. The programmable logic device of claim 1, wherein the at least one block of memory and the plurality of fuses comprise static random access memory cells.

4. The programmable logic device of claim 1, wherein the plurality of fuses are programmed during configuration of the programmable logic device to provide the first set of signals.

5. The programmable logic device of claim 1, wherein the first configuration and the second configuration determine a corresponding depth, width, and mode of the at least one block of memory.

6. The programmable logic device of claim 1, further comprising a plurality of logic blocks.

7. The programmable logic device of claim 1, wherein the plurality of fuses are incorporated into the at least one block of memory, with the at least one block of memory further comprising:
column circuits;
row circuits; and
control and decode circuits adapted to configure the at least one block of memory based on the first set of signals or the second set of signals.

8. The programmable logic device of claim 1, wherein the second set of signals is hard-coded within the programmable logic device.

9. An integrated circuit comprising;
a plurality of configurable blocks of memory;
a plurality of fuses adapted to provide a first set of signals for configuring the configurable blocks of memory; and
means for selecting between the first set of signals and a second set of signals for configuring the configurable blocks of memory.

10. The integrated circuit of claim 9, further comprising a control signal adapted to control the selecting means to select the first set of signals during a user mode of operation and the second set of signals during initialization of the configurable blocks of memory.

11. The integrated circuit of claim 9, wherein the configurable blocks of memory and the fuses comprise static random access memory.

12. The integrated circuit of claim 9, wherein the first set of signals and the second set of signals determine at least one of a depth, a width, and a mode of the configurable blocks of memory.

13. The integrated circuit of claim 9, wherein the integrated circuit comprises a programmable logic device, with the second set of signals hard-coded within the programmable logic device.

14. The integrated circuit of claim 13, further comprising:
a plurality of logic blocks; and
a plurality of configuration lines for providing configuration data to the fuses.

15. A method of configuring memory within an integrated circuit, the method comprising:
providing configuration data to fuses during configuration of the integrated circuit, wherein at least a first set of the fuses provides a first set of signals based on the stored configuration data for configuring at least one block of memory within the integrated circuit; and
selecting between the first set of signals and a second set of signals for configuring the at least one block of memory.

16. The method of claim 15, wherein the first set of signals is selected to configure the at least one block of memory during a user mode of operation and the second set of signals is selected to configure the at least one block of memory during a memory initialization mode of operation.

17. The method of claim 15, wherein the second set of signals is selected to configure the at least one block of memory during a user mode of operation and the first set of signals is selected to configure the at least one block of memory during a memory initialization mode of operation.

18. The method of claim 15, wherein the first set of signals is selected to configure the at least one block of memory during a user mode of operation after the second set of signals was selected to configure the at least one block of memory during a memory initialization mode of operation.

19. The method of claim 15, providing a control signal to control the selecting between the first set of signals and the second set of signals.

20. The method of claim 15, providing a hard-coded signal to provide as the second set of signals.

* * * * *